US010354034B1

(12) United States Patent
Agrawal et al.

(10) Patent No.: US 10,354,034 B1
(45) Date of Patent: Jul. 16, 2019

(54) SYSTEM AND METHOD FOR TUNING A GRAPHICAL HIGHLIGHT SET TO IMPROVE HIERARCHICAL LAYOUT EDITING

(71) Applicant: Cadence Design Systems, Inc., San Jose, CA (US)

(72) Inventors: Sunil Agrawal, Noida (IN); Devendra Deshpande, Noida (IN)

(73) Assignee: CADENCE DESIGN SYSTEMS INC., San Jose, CA (US)

( * ) Notice: Subject to any disclaimer, the term of this patent is extended or adjusted under 35 U.S.C. 154(b) by 0 days.

(21) Appl. No.: 15/273,296

(22) Filed: Sep. 22, 2016

(51) Int. Cl.
G06F 15/04 (2006.01)
G06F 17/50 (2006.01)

(52) U.S. Cl.
CPC .............................. *G06F 17/5068* (2013.01)

(58) Field of Classification Search
CPC ....... H01L 2224/73265; H01L 27/0207; H01L 27/10876; H01L 27/10894; H01L 21/84; H01L 2224/81005; H01L 2224/48227; H01L 2924/13091; H01L 27/105; H01L 2924/1306; H01L 27/1266; G06F 17/505; G06F 17/5081; G06F 17/5072; G06F 17/5036; G06F 17/5068; G06F 2217/12; G06F 2212/2022; G06F 17/5022; G06F 21/79; G06F 2217/74; G06F 21/86; G06F 2221/2129; G06F 12/00; G06F 12/0246; G06F 12/0638; G06F 12/10; G06F 13/385; G06F 13/4239; G06F 2212/205; G06F 2212/251; G06F 2212/7201; G06F 2212/7206; G06F 2217/04; G06F 2217/40; G06F 3/061; G06F 3/0629; G06F 3/0685; G06F 17/50; G06F 17/5009; G06F 17/5031; G06F 17/5077; G06F 2217/08; G06F 2217/38; G06F 2217/84; G06F 17/504; G06F 17/5045; G06F 2217/06; G06F 2217/66; G06F 12/0828; G06F 12/0866; G06F 1/1626; G06F 2217/10; G06F 2217/62; G06F 9/453; G06F 16/20; G06F 16/26; G06F 16/3346; G06F 16/435; G06F 17/211; G06F 17/2241; G06F 3/12; G06F 8/447; G06F 8/48; G03F 9/7076; G03F 9/7084; G11C 8/12

(Continued)

(56) References Cited

U.S. PATENT DOCUMENTS 7,810,063 B1 10/2010 Sharma et al.
7,917,877 B2 3/2011 Singh et al.
(Continued)

*Primary Examiner* — Binh C Tat
(74) *Attorney, Agent, or Firm* — Foley & Lardner LLP

(57) ABSTRACT

The present embodiments relate generally to integrated circuit design, and more particularly to techniques that automatically and dynamically create or adjust a highlight set in a graphical user interface for allowing designers to edit layouts in a hierarchical design in a more productive manner. According to certain aspects, in dense designs and/or designs having complete or partial overlapping shapes, embodiments allow for highlighting more than one hierarchy level with tuned parameters that improve the user experience and enhance user work productivity. According to other aspects, embodiments allow for highlighting shapes using colors and/or widths that allow both highlight and shape to be clearly visible and distinguishable.

20 Claims, 11 Drawing Sheets

(58) Field of Classification Search
USPC .................................. 716/100–106, 136–139
See application file for complete search history.

(56) References Cited

U.S. PATENT DOCUMENTS

| | | | |
|---|---|---|---|
| 8,046,730 B1 | 10/2011 | Ferguson et al. | |
| 8,255,845 B2 | 8/2012 | Ginetti | |
| 8,640,080 B1 | 1/2014 | Salowe et al. | |
| 9,330,219 B2 * | 5/2016 | Yang | G06F 17/5068 |
| 2003/0163791 A1 * | 8/2003 | Falbo | G03F 1/36 |
| | | | 716/52 |
| 2014/0053123 A1 * | 2/2014 | Granik | G06F 17/5072 |
| | | | 716/122 |

* cited by examiner

SYSTEM AND METHOD FOR TUNING A GRAPHICAL HIGHLIGHT SET TO IMPROVE HIERARCHICAL LAYOUT EDITING

TECHNICAL FIELD

The present disclosure relates generally to integrated circuits and more particularly to techniques for tuning highlight sets in a graphical user interface for performing hierarchical layout editing of integrated circuit designs.

BACKGROUND

Conventional integrated circuits can comprise billions of devices on many different layers. Custom and other designs of integrated circuits can be created using electronic design automation (EDA) technologies that typically run on an operating system in conjunction with a microprocessor-based computer system or other programmable control system. Conventional EDA systems typically generate a layout of shapes corresponding to circuit elements (e.g., gates, transistors, etc.) for each of the different layers. In many design applications, the EDA software can further include functionality that allows a user to implement "cells" as a basic element of functionality through a layout editor implemented on a graphical user interface (GUI). A given cell may be placed, or "instanced," many times in a layout design to accelerate the design process.

A hierarchical design is an electronic circuit design having a collection of different levels (e.g., level 0, 1, 2, . . . , n), wherein each higher level hides the details and shapes of the lower levels to simplify the design process. That is, a design hierarchy allows the circuit design to be broken down into a collection of smaller designs (or levels), thus reducing visual complexity of the design process, and enabling the EDA system to work with a collection of smaller design files so the design tools can run faster.

Using a GUI, a designer can easily issue commands to the EDA tool to edit the current cellview design in a hierarchical design. Circuit designers generally create a design and reuse it by placing an instance of the cellview inside another design and this way a level of hierarchy can be created. Many EDA tools (e.g., layout editor tools) support conventional "Edit-In-Place" (EIP) & "Descend" commands for hierarchical layout editing. Using such commands one can descend into the lower level cellview from the current cellview and edit it without opening its master cellview explicitly. When a command is invoked, then on mouse hover, a graphical highlight appears around the shape underneath the mouse cursor. This highlight indicates that on command execution (e.g., mouse click or other user interaction with the GUI), the user will be able to edit the cellview where that shape is present. Although these conventional graphical highlights and GUI commands are helpful, there are many situations where problems with them can arise that decrease or limit user productivity, for example in very dense designs and/or designs having shapes or colors that are difficult to highlight effectively and unambiguously. Moreover, these conventional graphical highlights do not always effectively convey hierarchy information, which would be useful for making decisions for further editing commands.

SUMMARY

The present embodiments relate generally to integrated circuit design, and more particularly to techniques that automatically and dynamically create or adjust a highlight set in a graphical user interface for allowing designers to edit layouts in a hierarchical design in a more productive manner. According to certain aspects, in dense designs and/or designs having complete or partial overlapping shapes, embodiments allow for highlighting more than one hierarchy level with tuned parameters that improve the user experience and enhance user work productivity. According to other aspects, embodiments allow for highlighting shapes using colors and/or widths that allow both highlight and shape to be clearly visible and distinguishable.

BRIEF DESCRIPTION OF THE DRAWINGS

These and other aspects and features of the present embodiments will become apparent to those ordinarily skilled in the art upon review of the following description of specific embodiments in conjunction with the accompanying figures, wherein.

DETAILED DESCRIPTION OF THE PREFERRED EMBODIMENTS

The present embodiments will now be described in detail with reference to the drawings, which are provided as illustrative examples of the embodiments so as to enable those skilled in the art to practice the invention. Notably, the figures and examples below are not meant to limit the scope of the present embodiments to a single embodiment, but other embodiments are possible by way of interchange of some or all of the described or illustrated elements. Moreover, where certain elements of the present embodiments can be partially or fully implemented using known components, only those portions of such known components that are necessary for an understanding of the present embodiments will be described, and detailed descriptions of other portions of such known components will be omitted so as not to obscure the present embodiments. Embodiments described as being implemented in software should not be limited thereto, but can include embodiments implemented in hardware, or combinations of software and hardware, and vice-versa, as will be apparent to those skilled in the art, unless otherwise specified herein. In the present specification, an embodiment showing a singular component should not be considered limiting; rather, the present disclosure is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present embodiments encompass present and future known equivalents to the known components referred to herein by way of illustration.

According to certain general aspects, the present embodiments relate to techniques that automatically and dynamically create or adjust a highlight set in a graphical user interface for allowing designers to edit layouts in a hierarchical design in a more productive manner. In these and other embodiments, these automatic and/or dynamic highlight sets can be based on the relationship between a current cursor position and shapes of a hierarchical design that is currently being edited using a GUI of a layout editor tool that is adapted with the functionality of the present disclosure. Although the descriptions below will relate to tuning preferred highlight parameters such as highlight color, width and line type, the embodiments are not limited to these parameters and can include other audiovisual indicators and parameters.

According to certain additional aspects, the present applicants recognize several drawbacks to conventional approaches, examples of which are illustrated in FIGS. 1 to 4.

Figure 1:
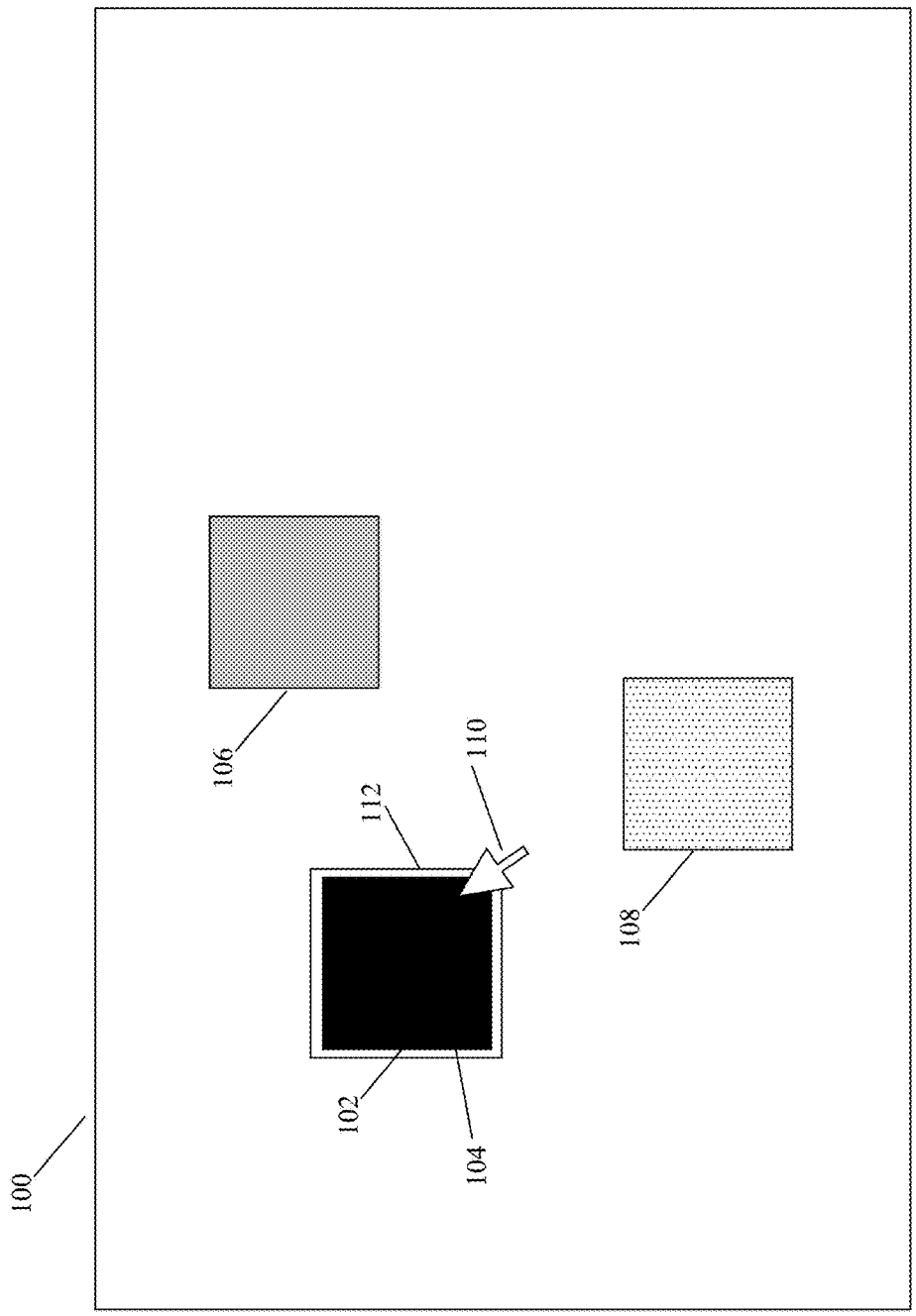
FIGS. 1 to 4 are diagrams illustrating aspects of problems arising from conventional user interface approaches to highlighting.

One problem with conventional approaches is that highlighting a shape alone does not provide any information about the hierarchy of the shape. This information can become very important for partial and exact overlapping cases. For example, FIG. 1 is a view 100 representing a conventional GUI display. This example display contains two different instances with shapes at a currently selected hierarchical level. One instance contains two shapes 102 and 108 and another instance contains shapes 104 and 106. In this example display, the two shapes 102 and 104 are overlapped. In this figure, for purposes of illustration, the shapes are shown as being entirely coextensive, but this is not typical or necessary. When a user hovers a cursor 110 on the overlapped shapes in the display, a single highlight 112 appears around the two overlapped shapes 102 and 104 but the display does not provide any further information whether on command execution a user would be descending into the instance containing shapes 102 and 108 or the instance containing shapes 104 and 106.

Figure 2:
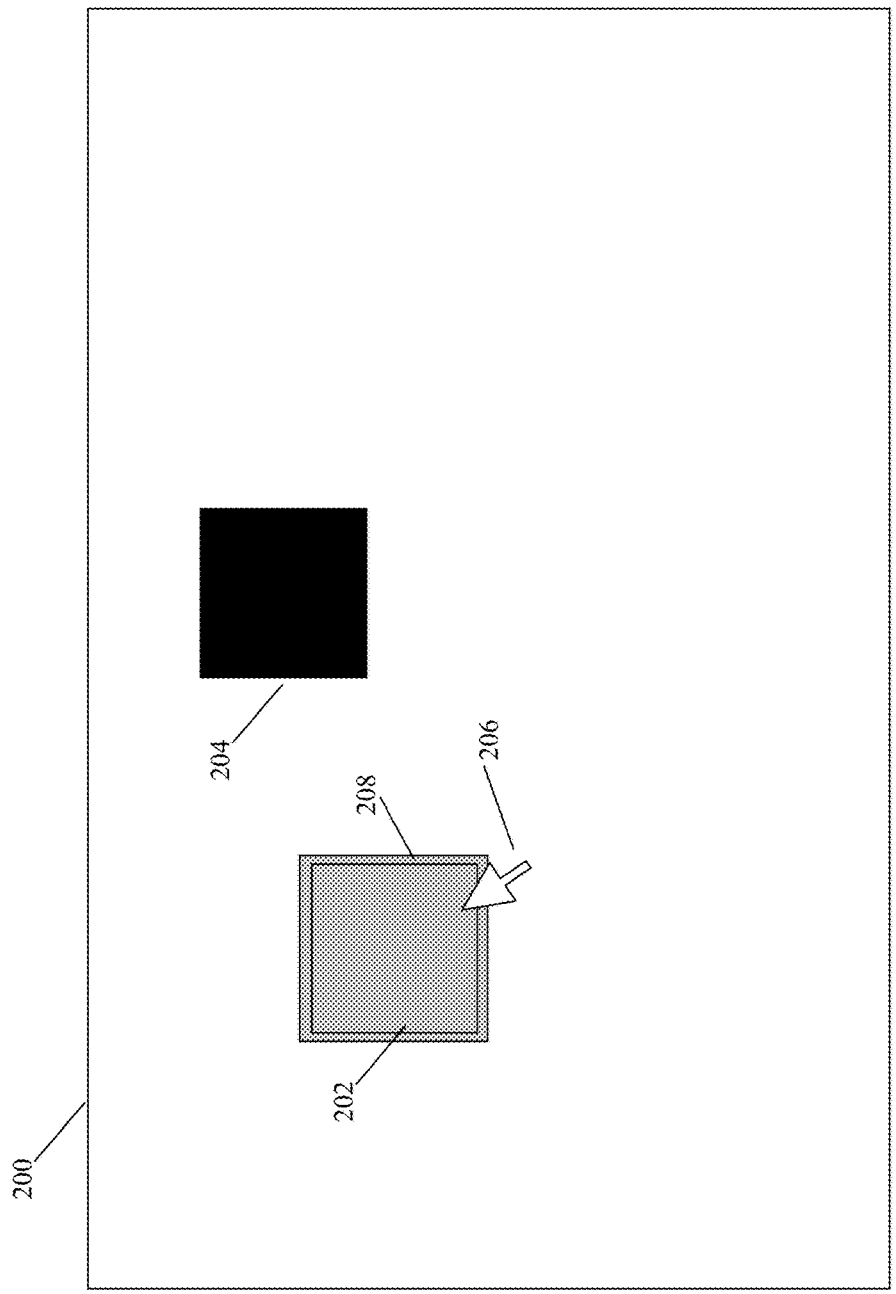

Another problem with conventional approaches is that typically the shape highlight color is fixed. This can become an issue when the highlight appears around a shape with the same color as the highlight color. In this case, the highlight becomes virtually invisible. For example, FIG. 2 is a view 200 representing a conventional GUI display. This example display for a currently viewable hierarchical level contains two shapes 202 and 204. When a user hovers a cursor 206 on shape 202 in the display, the highlight 208 is difficult to see because the highlight color and shape 202 color are almost identical.

Figure 3:
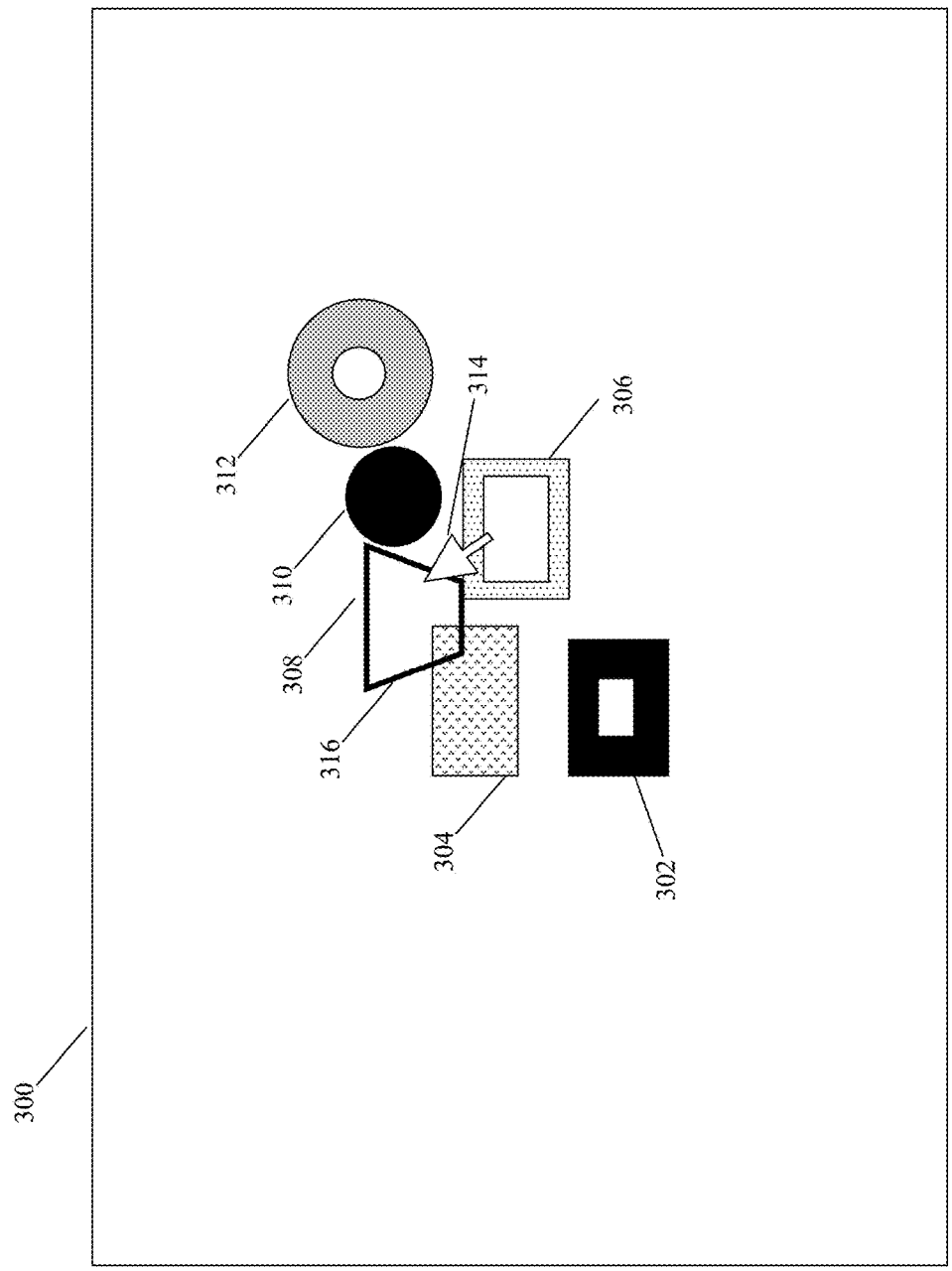

Yet another problem recognized by the present applicants is that graphical highlight width is static and fixed and so in a dense design, a user needs to zoom into the area to make the highlight sufficiently visible. When these zoom in or out operations need to be performed frequently while editing, it can cause user to lose to track and context of a particular location and area and result in a loss of user productivity. For example, FIG. 3 is a view 300 representing a conventional GUI display. In this example, there are two hierarchical instances in the design, each of two levels deep. Shapes 302, 304 and 306 are part of one instance and shapes 308, 310 and 312 are part of another instance. When a user hovers cursor 314 over shape 308, the highlight 316 is not very visible and also it does not give any information about hierarchy. So a user is required to perform a zoom-in operation to make any decision about further action.

Figure 4:
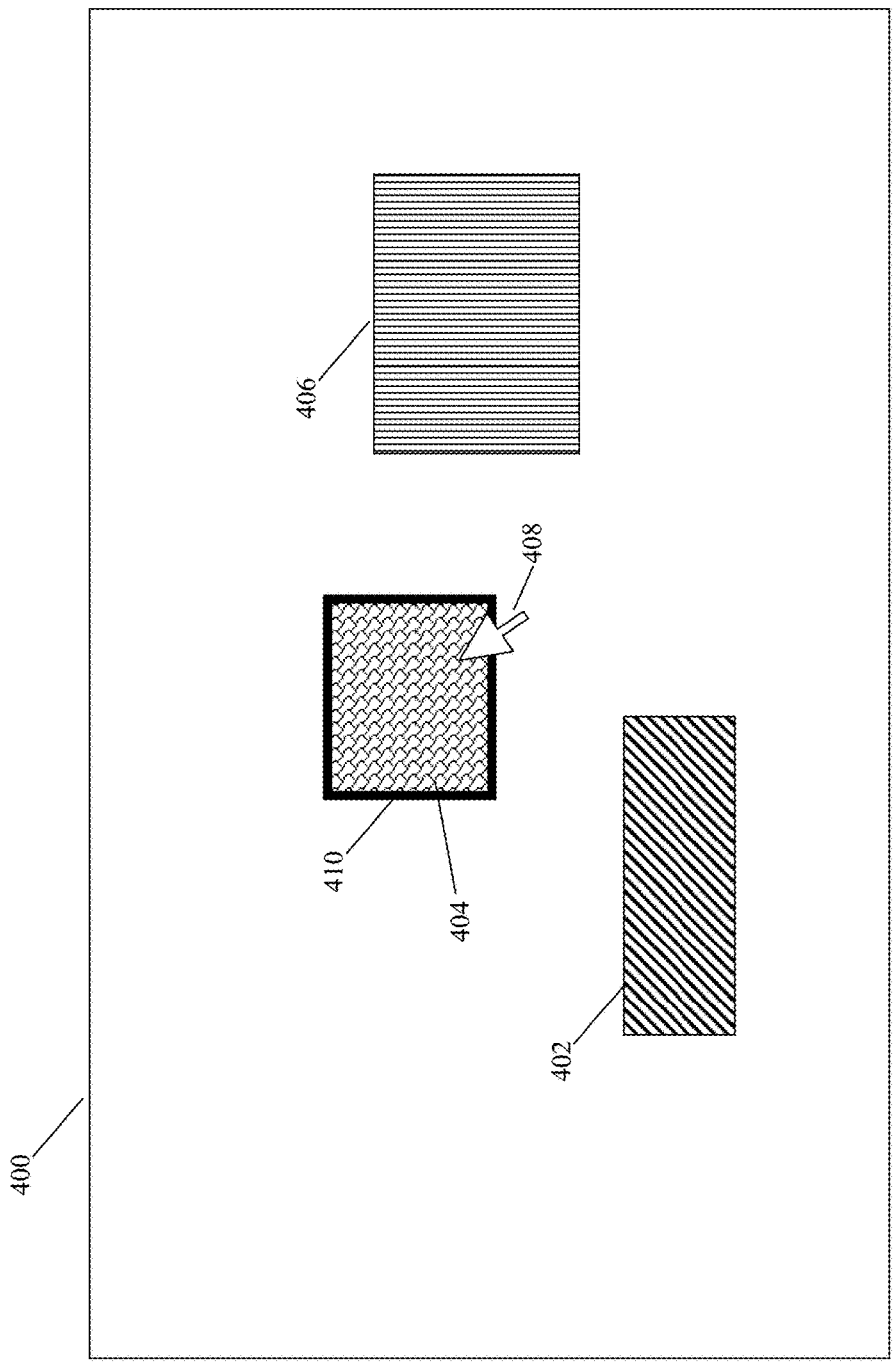

A still further problem with conventional approaches relates to the concept of figgroup in a custom layout. In general, a figgroup is a group of shapes and/or instances. More particularly, some example EDA tools allow such groups to be created to allow the user to manipulate the specified objects as a whole, rather than individually. So when the group is moved (or copied, deleted, etc.), all the objects in the group are moved (or copied, deleted, etc.). Objects can be added and removed from the figgroup as deemed necessary or desirable by the user. As such, defining figgroups is similar to creating another virtual level of hierarchy without creating an instance or master. But figgroups are different from instances. For example, if there are two rectangle shapes at level 0, and if a cell is created including these two rectangles, then an instance will be created at level 1. Meanwhile if a figgroup is created with these two rectangles, the figgroup will be created at level 0 only. Also, a figgroup cannot be instantiated (or placed) like a cell. In these example EDA tools, when highlighting a shape, no information is provided regarding whether the shape is part of an instance or a figgroup. For example, FIG. 4 is a view 400 representing a conventional GUI display. In this example, shapes 404 and 406 are part of the same figgroup, and all shapes 402, 404 and 406 are part of the same instance. When a user hovers cursor 408 over the figgroup shape 404, only shape 404 is highlighted with highlight 410 and no information is given whether it is part of a figgroup or an instance, or what other shapes in view 400 are related to shape 404 as belonging to either.

Example aspects of the present embodiments for addressing the above and other problems are illustrated in FIGS. 5 to 8.

Figure 5:
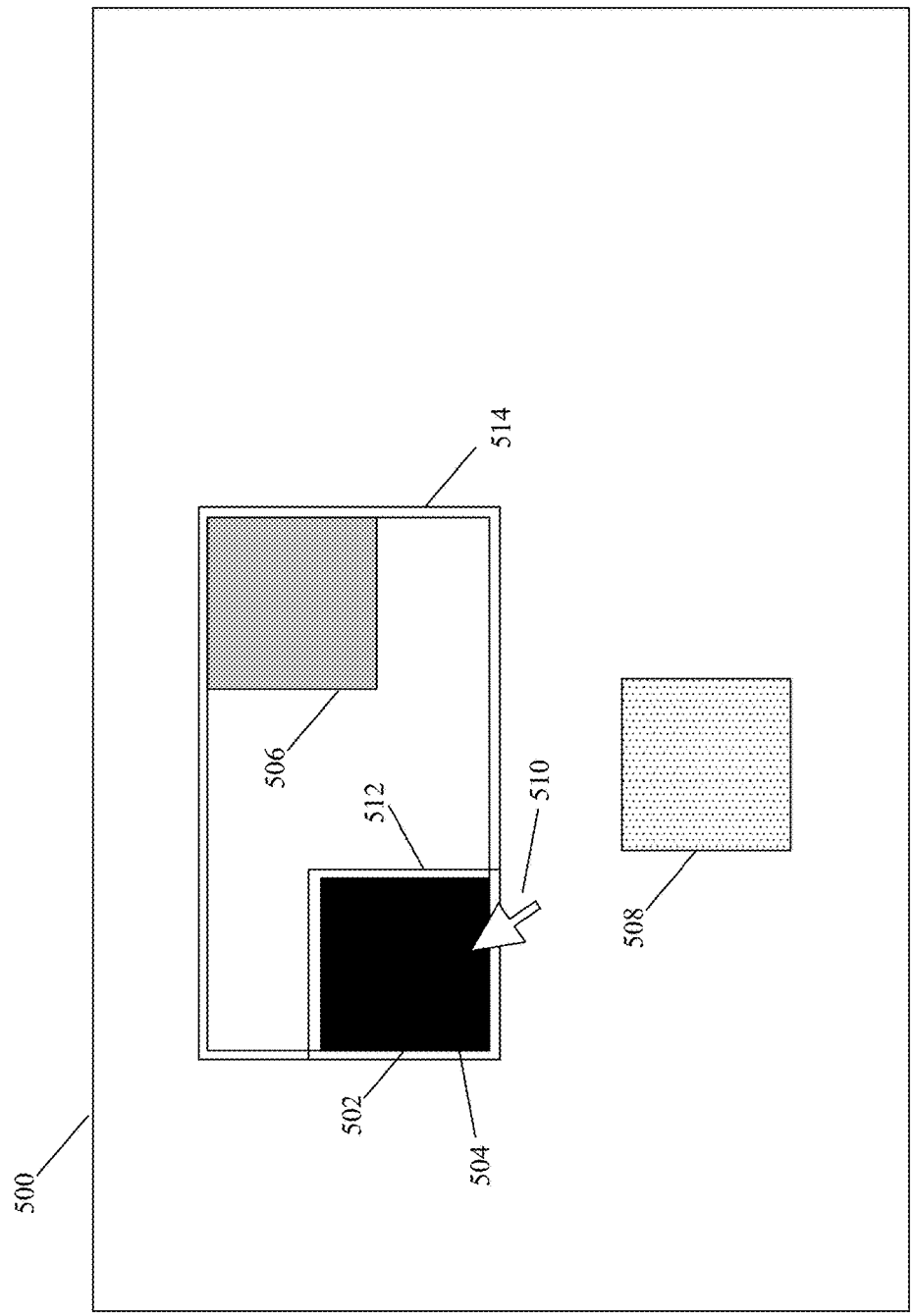
FIGS. 5 to 8 are diagrams illustrating aspects of solutions to the problems illustrated in FIGS. 1 to 4, respectively, according to the present embodiments.

In connection with the problems described above in FIG. 1, among others, instead of just highlighting the shape, embodiments of the invention highlight the complete or partial hierarchy based on viewable hierarchy levels or user selection. For example, FIG. 5 is a view 500 representing an example GUI display according to the present embodiments. As in FIG. 1, this example display contains two different instances at a currently selected hierarchical level. One instance contains two shapes 502 and 508 and another instance contains shapes 504 and 506. In this example display, the two shapes 502 and 504 are overlapped. In one example solution according to the present embodiments, when a user hovers cursor 510 over shape 502, not only is highlight 512 around the shape displayed, other shapes in its hierarchical instance are also highlighted. In particular for this example, highlight 514 is displayed around both shapes 504 and 506. Hence shape and instance both get highlighted and this gives the user a clear indication where the user would be descending on command execution.

Figure 6:
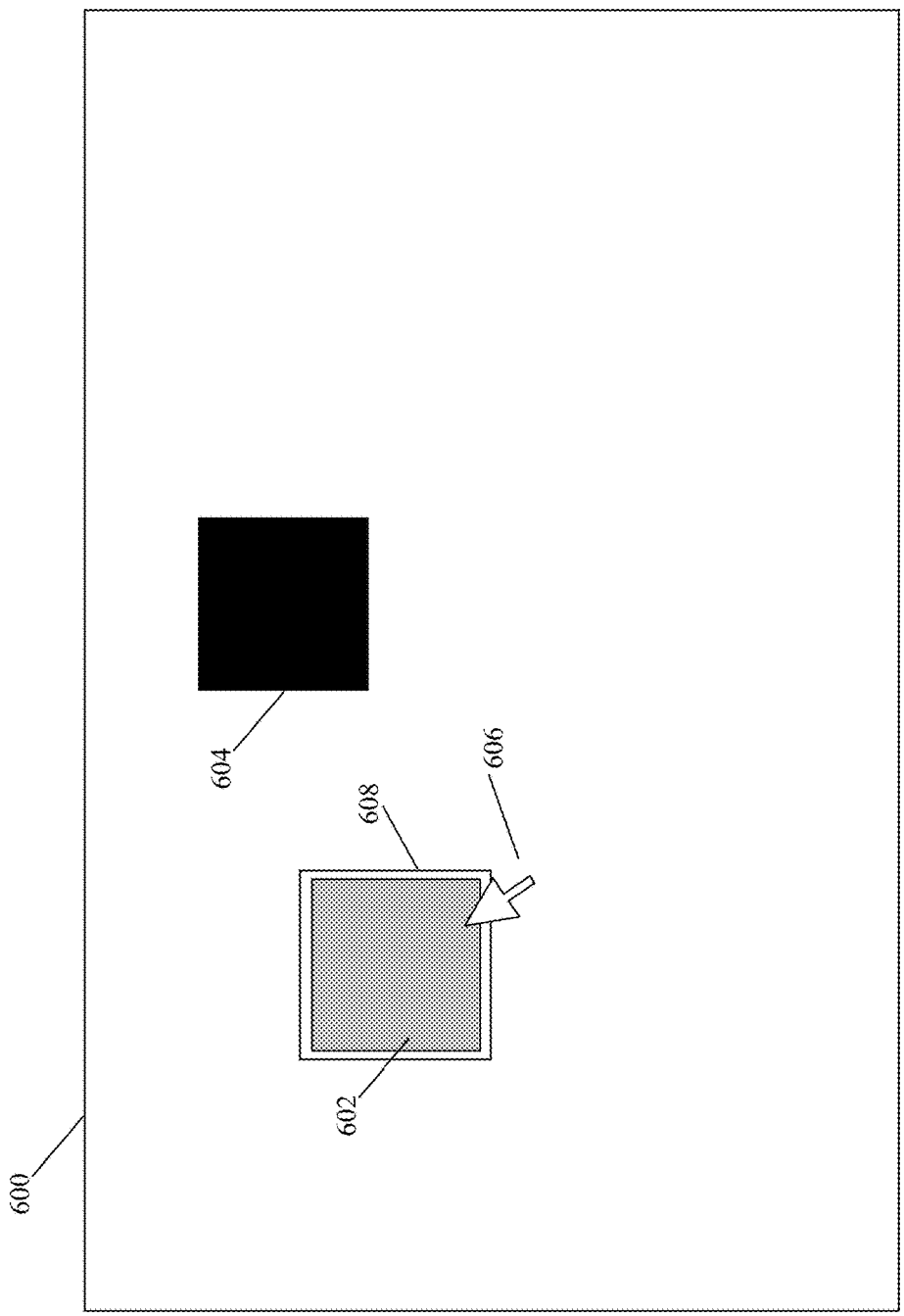

In connection with the problems described above in FIG. 2, among others, instead of a static highlight color, the highlight set color is tuned based on the cursor position. For example, FIG. 6 is a view 600 representing an example GUI display according to the present embodiments. As in FIG. 2, shapes 602 and 604 are displayed, and a user hovers a cursor 606 over shape 602. According to the present embodiments, based on the cursor position, the highlight color is changed, either automatically or by user control. So, as compared to FIG. 2, the highlight 608 in FIG. 6 is much more visible and gives the user a better indication where the user would be descending on command execution.

Figure 7:
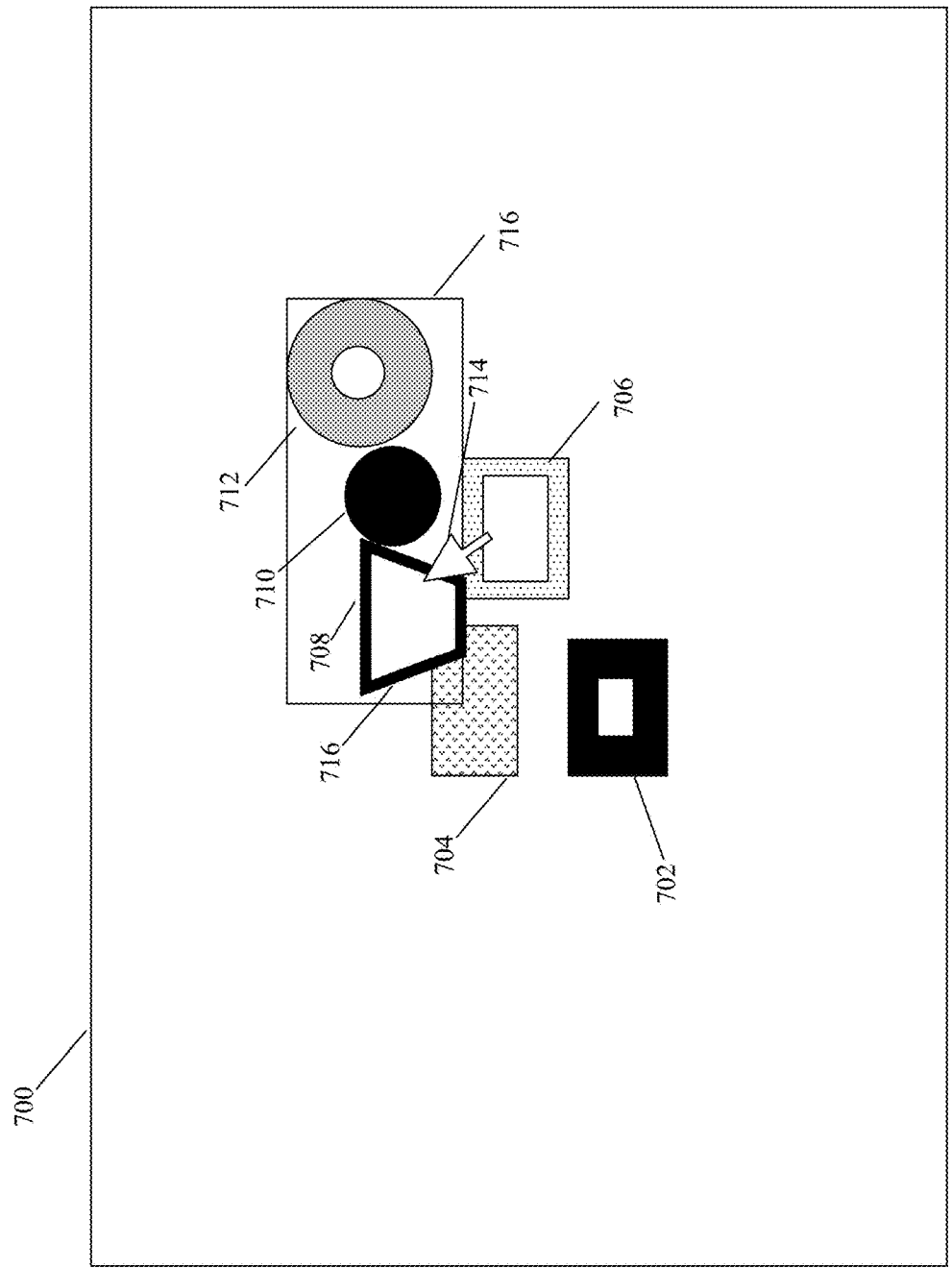

In connection with the problems described above in FIG. 3, among others, based on the cursor position, according to aspects of the present embodiments the highlight width and viewable level are changed either automatically or under user control. For example, FIG. 7 is a view 700 representing an example GUI display according to the present embodiments. As in FIG. 3, there are two hierarchical instances in the design, each of two levels deep. Shapes 702, 704 and 706 are part of one instance and shapes 708, 710 and 712 are part of another instance. Now when a user hovers cursor 714 over shape 708, the present embodiments change the width of highlight 708 and sets the viewable levels to two while outlining the other shapes 710 and 712 of the instance shared by shape 708. Hence the shape highlight 716 is much more visible and the instance highlight 718 gives a better indication where user would be descending on command execution.

Figure 8:
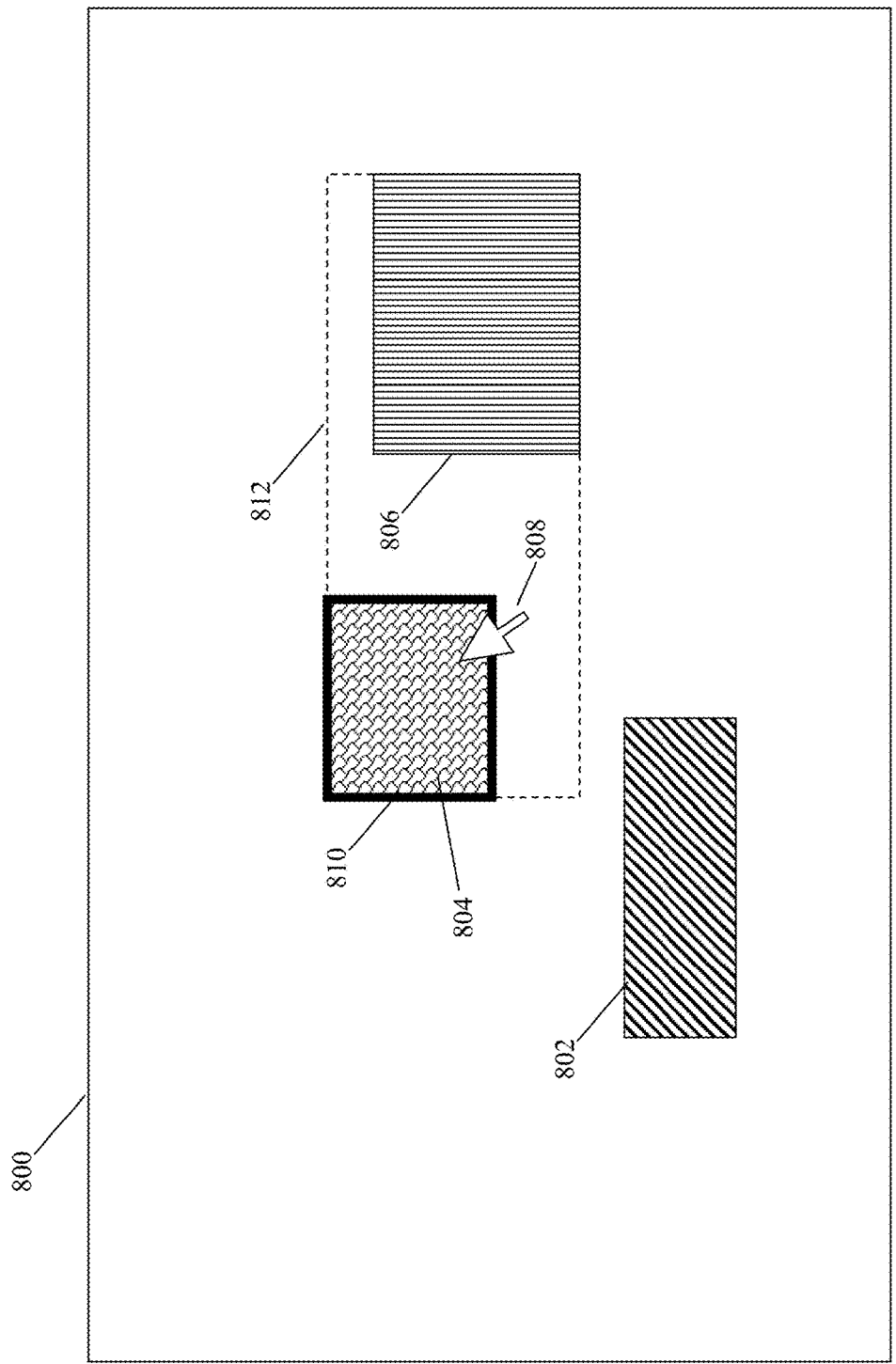

In connection with the problems described above in FIG. 4, among others, in the present embodiments the fig group is highlighted with a distinct highlight set to give a clear indication to the user that the shape is part of the fig group. For example, FIG. 8 is a view 800 representing an example GUI display according to the present embodiments. In this example, shapes 804 and 806 are part of the same figgroup, and all shapes 802, 804 and 806 are part of the same instance. When a user hovers cursor 808 over figgroup shape 804, a figgroup highlight 812 is displayed around shapes 804 and 806 in addition to shape highlight 810. According to additional aspects, the figgroup highlight 812 is different (e.g., dotted lines) than an instance highlight (not shown) to clearly indicate that shape 804 is part of a figgroup that is different from the instance.

Figure 9:
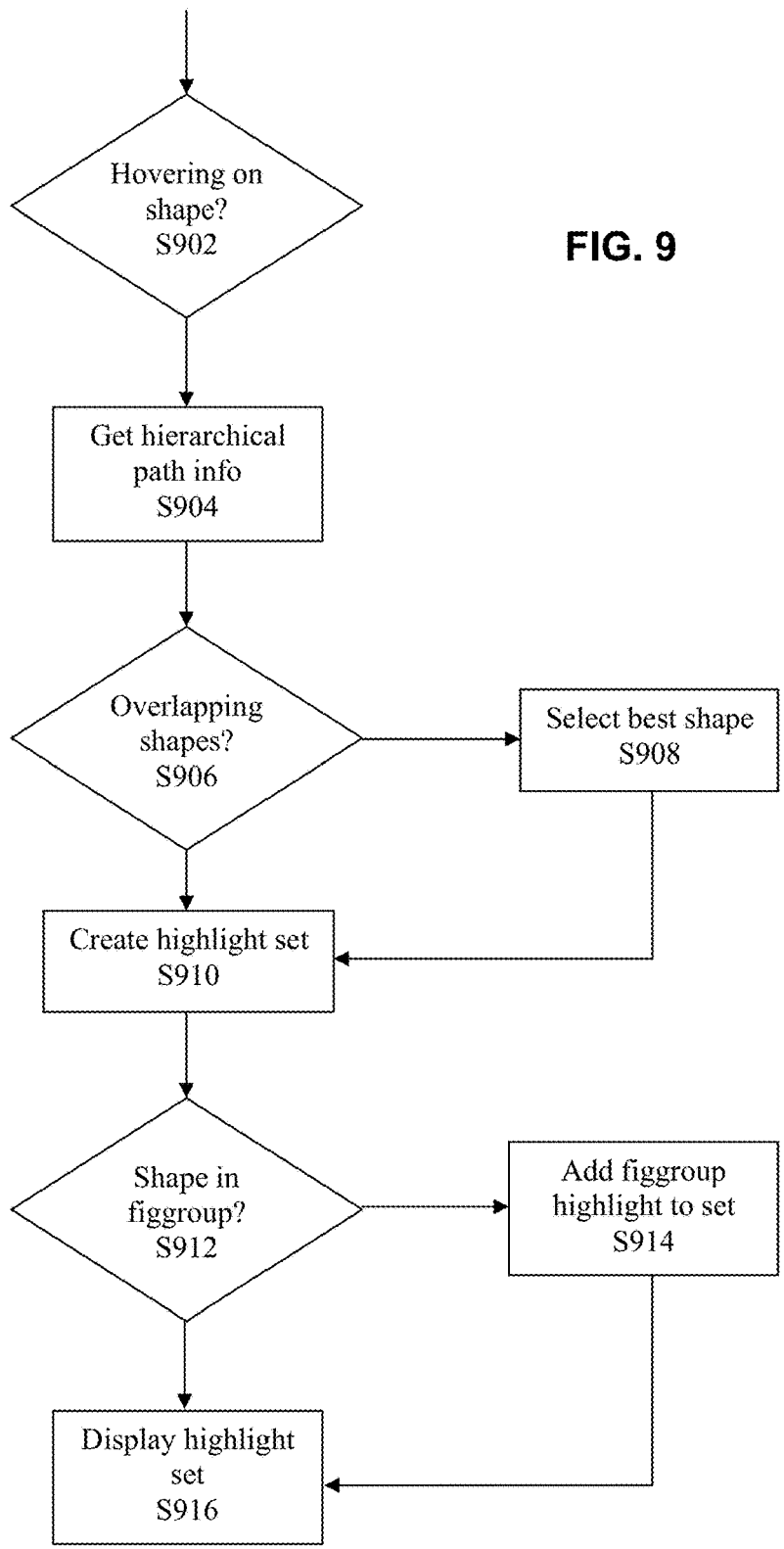
FIG. 9 is a flowchart illustrating an example methodology for creating tuned highlight sets according to the present embodiments.

FIG. 9 is a flowchart illustrating an example methodology for implementing these and other solutions for editing a hierarchical design according to embodiments.

In a first step S902, the current cursor position in the GUI is monitored until the cursor is hovering over a shape in a portion of the layout that is currently being displayed for editing. Those skilled in the art of user interfaces understand various ways to monitor a cursor position in a GUI and to detect a hover (e.g., the cursor remaining motionless for a threshold amount of time such as 2-3 seconds). These ways can depend on the operating system and/or the application software being used, and further details thereof will be omitted here for sake of clarity of the invention. Those skilled in the art of layout editors further understand that there are various ways to determine what shapes are being displayed, their visual boundaries, locations and colors in the display, and how to determine whether a cursor is located over a shape or shapes. Accordingly, further details thereof are not necessary for an understanding of the present invention and so will be omitted.

In step S904, the hierarchical path information is obtained for the shape or shapes being hovered over. This information can include the current hierarchical level being displayed, information regarding other levels, information regarding an instance to which the shape belongs, other shapes included in the instance and their hierarchical levels, etc. It should be noted that this obtained information is in addition to other standard information for the shape or shapes that are being maintained by the user interface to generate the display of shapes, such as locations, boundaries, colors, etc.

In step S906, it is checked whether more than one shape underneath the cursor was obtained in step S902. If not, processing advances to step S910. Otherwise, in step S908, the best shape is selected. For example, multiple parameters can be used in combination to determine the best shape, such as which shape is overall closest to the cursor, which shape is included in the current object of precedence, which shape is included in the current layer of precedence, etc. It should be noted that, although shown separately in FIG. 9 for illustrating example aspects of the embodiments, steps S902 to S908 can be performed separately or in combination in various ways. For example, an EDA tool can include a single query based on the current position that automatically determines the best shape underneath a cursor and simply returns the path information for that particular shape.

In step S910 a highlight set is created for this shape and its hierarchical levels. For example, based on the hierarchical information for this shape, this step includes, for each hierarchical level, creating a highlight set and enabling the created highlight set for display. The number of levels to be highlighted could be decided based on the viewable hierarchy level for this cursor position. For example, if there is a three level hierarchy and the current viewable layout area only shows two levels, then a shape highlight, a first level highlight around all the shapes in the same instance and hierarchy level (e.g., a line in the shape of a rectangle enclosing all of the shapes) and a second level highlight around all the shapes in the same instance and hierarchy level (a total of three highlights) would be created.

In accordance with additional aspects described above, step S910 can include determining the shape color information and adapting the shape highlight color if needed so that one can distinguish between the shape color and the highlight color. Those skilled in the art of user interfaces will understand how to determine a highlight color that is sufficiently different from the shape color to a human eye, and so further details thereof will be omitted here for sake of clarity of the invention.

In similar accordance with additional aspects described above, step S910 can include determining the proximity and/or number of other shapes surrounding the current shape and adapting the shape highlight width if needed so that one can distinguish the shape from the surrounding shapes. Those skilled in the art of user interfaces will understand how to determine a highlight width that is sufficiently distinctive to a human eye, and so further details thereof will be omitted here for sake of clarity of the invention.

In step S912, it is determined whether the shape belongs to a figgroup, perhaps as defined by a user as described above. If so, in step S916, a highlight around all the displayed shapes of the fig group is created with a distinct characteristic to distinguish from instance highlights (e.g., dotted lines as opposed to a solid line for instance highlights) to give a clear indication to the user that the shapes are all part of a fig group as opposed to an instance.

In step S914, the generated highlight set is displayed in the GUI, which can have aspects described above in connection with the highlights shown in FIGS. 5 to 8.

It should be noted that, based on the information obtained in step S904 for all possible overlapping shapes, if the highlighted shape is not the one user wants, the GUI can allow the user to toggle to a different shape by pressing a space bar key, for example. In such a case, processing could return to step S910 and a different highlight set could be created and displayed for that shape accordingly.

Figure 10:
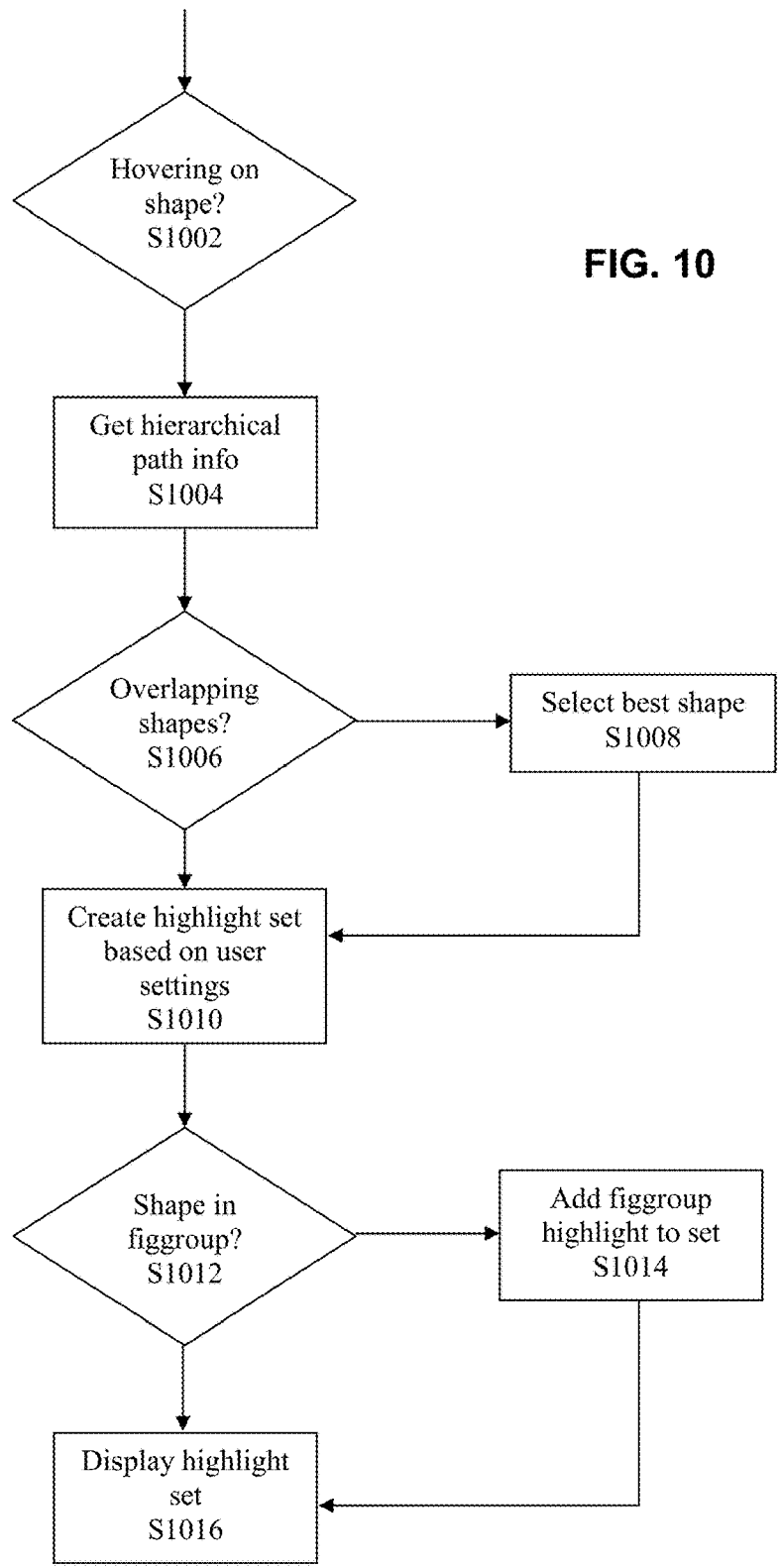
FIG. 10 is a flowchart illustrating another example methodology for creating tuned highlight sets according to the present embodiments.

FIG. 10 is a flowchart illustrating another example methodology for implementing the above and other solutions for editing a hierarchical design according to embodiments.

In a first step S1002, the current cursor position in the GUI is monitored until the cursor is hovering over a shape or shapes in a portion of the layout that is currently being displayed for editing. This can be performed similarly as described above in connection with step S902.

In step S1004, the hierarchical path information is determined for the detected shape or shapes. This information and the way it is obtained can be similar to that described in step S904 above.

In step S1006, it is determined if there more than one shape was detected in step S1002. If not, processing advances to step S1010. Otherwise, in step S1008, the best one of the shapes is selected. This can be done similarly as described above in connection with step S908.

In step S1010 a highlight set is created for this shape and its hierarchical levels. For example, similar to step S910, based on the hierarchical information for this shape, this step includes, for each hierarchical level, creating a highlight set and enabling the created highlight set for display. However, differently from the methodology shown in FIG. 9, step S1010 can further include creating the highlight set based on user settings for such parameters as highlight color, transparency and width. These settings can be configurable by the user using various user interface mechanisms known to those skilled in the art, such as drop-down menus, pop-up menus, dialog boxes, etc. Additionally or alternatively, these settings can be configured through environment variables or other various ways known to those skilled in the art.

The number of levels to be highlighted could also be decided based on user settings that are configured as described above. For example, if there is a three level hierarchy and the user only wants to see two levels as selected as described above, then a shape highlight, a first level highlight around all the shapes in the same instance and hierarchy level (e.g., a line in the shape of a rectangle enclosing all of the shapes) and a second level highlight around all the shapes in the same instance and hierarchy level (a total of three highlights) would be created.

In accordance with additional aspects described above, step S1010 can include dynamically allowing the user to set the highlight color and/or the highlight width.

In step S1012, it is determined whether the shape belongs to a fig group, which can be done similarly to that described in S912 above. If so, in step S1014, a highlight around all the displayed shapes of the fig group is created as described above.

In step S1016, the generated highlight set is displayed in the GUI.

Similar to the method shown in FIG. 9, it should be noted that, based on the information obtained in step S1004 for all possible overlapping shapes, if the highlighted shape is not the one user wants, the GUI can allow the user to toggle to a different shape by pressing a space bar key, for example. In such a case, processing could return to step S1010 and a different highlight set could be created and displayed for that shape accordingly.

It should be further noted that the methodologies of FIGS. 9 and 10 are not necessarily exclusive, and embodiments can include any combination of steps described above.

Figure 11:
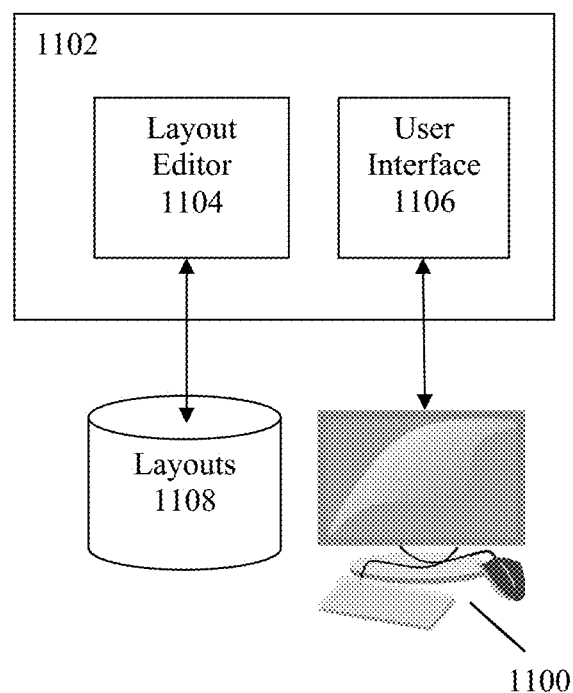
FIG. 11 is a block diagram illustrating an example system according to the present embodiments.

FIG. 11 is a block diagram of an example system according to the present embodiments.

As shown, the system includes an EDA tool 1102 including a layout editor 1104 and user interface module 1106 that have been adapted with the tuned highlight set functionality of the present invention. It should be noted that the principles of the present embodiments are not limited to layout editor tools, and those skilled in the art will understand how to extend these principles to other types of EDA tools after being taught by the present examples.

In these and other embodiments, EDA tool 1102 may include additional interactive or automated modules for interactively implementing physical electronic designs that are not shown such as a placer, a routing engine, a design rule checker, a verification engine, or a floorplanner, etc. as will be appreciated by those skilled in the art. In other embodiments, EDA tool 1102 is a standalone application that only includes layout editor functionality and/or is adapted to communicate with other automated EDA modules.

In embodiments, system 1100 can be implemented by one or more general purpose computers that are loaded with an operating system executing software and/or customized to include hardware for interactively implementing physical electronic designs and adapted with the tuned highlight set functionality of the present disclosure. In some embodiments, the one or more computing systems comprise various components not shown such as the processor(s) or processor core(s), memory, disks, etc. The one or more computing systems may further write to and read from a local or remote volatile or non-volatile computer accessible storage not shown that stores thereon data or information such as, but not limited to, one or more databases such as schematic design database(s) or physical design database(s), libraries, data, rule decks, constraints, etc. and/or other information or data that may be required to support the methodology of the present embodiments. In some embodiments, the one or more computing systems are implemented in a "cloud" configuration and/or a client/server configuration. For example, one or more server computers may be loaded with application software (e.g., a layout editor tool) for implementing some or all of the methodology of the present embodiments, and one or more client computers can communicate with the server computer(s) via a network to perform some or all of the methodology of the embodiments for a particular design.

In operation, a user can interact with layout editor tool 1104 via user interface module 1106 to create or edit highlight set parameters such as color and width as described above. In addition, when layout editor 1104 is being used to create or modify a portion of a layout stored in layouts 1108, using the methodology described above, for example, in response to user actions conducted using interface devices 1110 (e.g., mouse, trackball, touchpad, touchscreen, etc.) and user interface 1106, layout editor 1104 creates tuned highlight sets and displays them to the user via user interface devices 1110 (e.g., display monitor) and user interface 1106. Layout editor 1104 further includes conventional functionality for receiving and updating layout information (e.g., GDS II data) for the current design in layouts 1108 in response to the user actions.

Although the present embodiments have been particularly described with reference to preferred ones thereof, it should be readily apparent to those of ordinary skill in the art that changes and modifications in the form and details may be made without departing from the spirit and scope of the present disclosure. It is intended that the appended claims encompass such changes and modifications.

What is claimed is:

1. A method of operating a display of a computing device, the display comprising a user interface for a circuit design tool for modifying a design of an integrated circuit, comprising:

monitoring movement of a cursor in the user interface for the circuit design tool that includes a display of one or more shapes in the design for one or more layers of the integrated circuit;

collecting information for the one or more shapes in response to a detected hover position of the cursor in the user interface for the circuit design tool, wherein the detected hover position corresponds to the monitoring step determining that the cursor has been positioned over the display of the one or more shapes in the user interface for a predetermined amount of time;

adjusting one or more features of a highlight set for display in the user interface for the circuit design tool based on the collected information, wherein the highlight set is used to determine graphical highlights that are displayed in the user interface together with the display of the one or more shapes in the design;

causing the display to be changed by causing one or more graphical highlights to be displayed together with certain of the one or more shapes in the design in the user interface for the circuit design tool based on the adjusted highlight set, while the circuit design tool is in an operational state during which the one or more shapes in the design can be edited via the user interface; and generating an output that can be used to fabricate the integrated circuit according to the design.

2. The method of claim 1, wherein the one or more shapes is two or more shapes, and wherein the collected information includes hierarchy information for the two or more shapes, and wherein adjusting includes creating a hierarchical highlight around two or more of the shapes in addition to a shape highlight around a single one of the shapes.

3. The method of claim 1, wherein the collected information includes shape color information for the one or more shapes, and wherein adjusting includes setting the color of a shape highlight around a single one of the shapes to visually contrast with a color of the single shape.

4. The method of claim 1, wherein the one or more shapes is two or more shapes, and wherein the collected information includes one or both of proximity and number information for shapes surrounding a single one of the shapes, and wherein adjusting includes setting a width of a shape highlight around the single shape based on the collected information.

5. The method of claim 1, wherein the one or more shapes is two or more shapes, and wherein the collected information includes group information for the two or more shapes, and wherein adjusting includes creating a group highlight around two or more of the shapes in addition to a shape highlight around a single one of the shapes.

6. The method of claim 2, wherein the collected information further includes group information for the two or more shapes, and wherein adjusting includes creating a group highlight around a second two or more of the shapes in addition to the hierarchical highlight and the shape highlight, the group highlight and the hierarchical highlight being visually distinguishable from each other.

7. The method of claim 2, wherein the collected information further includes shape overlap information for the two or more shapes, and wherein adjusting includes selecting a best one of two or more overlapping shapes, the shape highlight and the group highlight being created for the best shape.

8. The method of claim 2, wherein the hierarchical highlight is created so as to outline two or more shapes that belong to the same instance in the design.

9. The method of claim 2, wherein the hierarchical highlight is created so as to outline two or more shapes that belong to the same one or more hierarchical levels in the design.

10. The method of claim 1, wherein adjusting includes dynamically adjusting the features in accordance with user preferences.

11. A non-transitory computer readable storage medium having instructions stored thereon, which when executed by a computer, cause the computer to perform a method of modifying a design of an integrated circuit, the method comprising:

monitoring movement of a cursor in a user interface for a circuit design tool that includes a display of one or more shapes in the design for one or more layers of the integrated circuit;

collecting information for the one or more shapes in response to a detected hover position of the cursor in the user interface for the circuit design tool, wherein the detected hover position corresponds to the monitoring step determining that the cursor has been positioned over the display of the one or more shapes in the user interface for a predetermined amount of time;

adjusting one or more features of a highlight set for display in the user interface for the circuit design tool based on the collected information, wherein the highlight set is used to determine graphical highlights that are displayed in the user interface together with the display of the one or more shapes in the design;

causing one or more graphical highlights to be displayed together with certain of the one or more shapes in the design in the user interface for the circuit design tool based on the adjusted highlight set;

responsive to the one or more shapes in the design being selected for edit via the user interface, causing the design of the integrated circuit to be changed, thereby facilitating fabrication of the integrated circuit in accordance with the changed design; and generating an output that can be used to fabricate the integrated circuit according to the changed design.

12. The non-transitory computer readable storage medium of claim 11, wherein the one or more shapes is two or more shapes, and wherein the collected information includes hierarchy information for the two or more shapes, and wherein adjusting includes creating a hierarchical highlight around two or more of the shapes in addition to a shape highlight around a single one of the shapes.

13. The non-transitory computer readable storage medium of claim 11, wherein the collected information includes shape color information for the one or more shapes, and wherein adjusting includes setting the color of a shape highlight around a single one of the shapes to visually contrast with a color of the single shape.

14. The non-transitory computer readable storage medium of claim 11, wherein the one or more shapes is two or more shapes, and wherein the collected information includes one or both of proximity and number information for shapes surrounding a single one of the shapes, and wherein adjusting includes setting a width of a shape highlight around the single shape based on the collected information.

15. The non-transitory computer readable storage medium of claim 12, wherein the collected information further includes group information for the two or more shapes, and wherein adjusting includes creating a group highlight around a second two or more of the shapes in addition to the hierarchical highlight and the shape highlight, the group highlight and the hierarchical highlight being visually distinguishable from each other.

16. The non-transitory computer readable storage medium of claim 12, wherein the collected information further includes shape overlap information for the two or more shapes, and wherein adjusting includes selecting a best one of two or more overlapping shapes, the shape highlight and the group highlight being created for the best shape.

17. The non-transitory computer readable storage medium of claim 12, wherein the hierarchical highlight is created so as to outline one or both of two or more shapes that belong to the same instance in the design and two or more shapes that belong to the same one or more hierarchical levels in the design.

18. The non-transitory computer readable storage medium of claim 11, wherein adjusting includes dynamically adjusting the features in accordance with user preferences.

19. A system comprising:
a circuit design tool comprising one or modules for interactively modifying a design of an integrated circuit comprising a plurality of layers, the circuit design tool including:
   a user interface that monitors movement of a cursor in a display of one or more shapes in the design;
   a storage containing one or more files corresponding to the design, wherein the one or more files are configured for enabling the fabrication of the integrated circuit in accordance with the design; and
   a layout editor that collects information for the one or more shapes in response to a detected hover position of the cursor in the user interface, wherein the detected hover position corresponds to the monitoring performed by the user interface determining that the cursor has been positioned over the display of the one or more shapes in the user interface for a predetermined amount of time, and adjusts one or more features of a highlight set for display by the user interface in the display based on the collected information, wherein the highlight set is used to determine graphical highlights that are displayed in the user interface together with the display of the one or more shapes in the design, the layout editor further causing one or more graphical highlights to be displayed together with certain of the one or more shapes in the design in the user interface for the circuit design tool based on the adjusted highlight set, and wherein the layout editor is operative to change the contents of the one or more files in response to changes to the one or more shapes in the design performed via the user interface, and wherein the layout editor is further operative to generate an output that can be used to fabricate the integrated circuit according to the design.

20. The system of claim 19, wherein the one or more shapes is two or more shapes, and wherein the collected information includes hierarchy information for the two or more shapes, and wherein the layout editor adjusts the one or more features of the highlight set by creating a hierarchical highlight around two or more of the shapes in addition to a shape highlight around a single one of the shapes.

* * * * *